(12) United States Patent
Hamilton et al.

(10) Patent No.: US 6,967,873 B2
(45) Date of Patent: Nov. 22, 2005

(54) MEMORY DEVICE AND METHOD USING POSITIVE GATE STRESS TO RECOVER OVERERASED CELL

(75) Inventors: Darlene G. Hamilton, San Jose, CA (US); Zhizheng Liu, Sunnyvale, CA (US); Mark W. Randolph, San Jose, CA (US); Yi He, Freemont, CA (US); Edward Hsia, Saratoga, CA (US); Kulachet Tanpairoj, Palo Alto, CA (US); Mimi Lee, Santa Clara, CA (US); Alykhan Madhani, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 222 days.

(21) Appl. No.: 10/677,790

(22) Filed: Oct. 2, 2003

(65) Prior Publication Data

US 2005/0073886 A1 Apr. 7, 2005

(51) Int. Cl.[7] .............................................. G11C 11/34
(52) U.S. Cl. ................................ 365/185.3; 365/185.29
(58) Field of Search .......................... 365/185.3, 185.29

(56) References Cited

U.S. PATENT DOCUMENTS

| | | | |
|---|---|---|---|
| 5,400,286 A | 3/1995 | Chu et al. ................... 365/218 |
| 5,680,350 A | 10/1997 | Lee ........................ 365/185.24 |
| 6,125,059 A | * 9/2000 | Hecht ..................... 365/185.29 |
| 6,184,088 B1 | * 2/2001 | Kurooka et al. ............ 438/264 |
| 6,233,177 B1 | * 5/2001 | Shokouhi et al. ....... 365/185.23 |
| 6,285,587 B1 | * 9/2001 | Kwon .................... 365/185.11 |
| 6,370,062 B2 | * 4/2002 | Choi ..................... 365/185.23 |
| 6,834,012 B1 | * 12/2004 | He et al. ............... 365/185.18 |

FOREIGN PATENT DOCUMENTS

WO    03 063167 A2    7/2003

OTHER PUBLICATIONS

International Search Report for International Application No. PCT/US2004/030694, Feb. 9, 2005.
Written Opinion of the International Searching Authority for International Application No. PCT/US2004/030694, Feb. 9, 2005.

* cited by examiner

*Primary Examiner*—Michael Tran

(57) ABSTRACT

A method of erasing a flash electrically erasable read only memory (EEPROM) device composed of a plurality of memory cells includes pre-programming the plurality of memory cells, applying an erase pulse to the plurality of memory cells followed by an erase verification. The erase verification is followed by soft programming any memory cells having a threshold voltage below a predetermined minimum level and applying a positive gate stress to the plurality of memory cells. The erase method prevents overerasing and provides a tightened threshold voltage distribution.

20 Claims, 7 Drawing Sheets

MEMORY DEVICE AND METHOD USING POSITIVE GATE STRESS TO RECOVER OVERERASED CELL

TECHNICAL FIELD

The present invention relates generally to the field of non-volatile memory devices and, more particularly, to a flash memory device, such as a charge trapping dielectric flash electrically erasable programmable read only memory (EEPROM), and a method of erasing the same.

BACKGROUND

A pervasive trend in modern integrated circuit manufacture is to increase the number of data bits stored per unit area on an integrated circuit memory unit, such as a flash electrically erasable programmable read only memory (EEPROM) unit. Memory units often include a relatively large number of core memory devices (sometimes referred to as memory cells), For instance, a conventional charge trapping dielectric flash memory device is capable of storing two bits of data in "double-bit" format. That is, one bit can be stored using a memory cell on a first side of the memory device and a second bit can be stored using a memory cell on a second side of the memory device.

Each memory device is operatively arranged to be programmed, read and erased by the application of appropriate voltage potentials. Typically, the gate electrode of each device can be coupled to a wordline and the source and the drain can each be coupled to a bitline for applying the various voltage potentials to the corresponding components of the memory device.

Programming of such a device can be accomplished, for example, by hot electron injection. Hot electron injection involves applying appropriate voltage potentials to each of the gate electrode, the source, and the drain of the memory device for a specified duration until the charge storing layer accumulates charge. Such a process, with respect to a NOR architecture memory device is disclosed in co-owned U.S. Pat. No. 6,215,702, which is incorporated herein by reference in its entirety.

Erasing of such a device can be accomplished, for example, by hot hole injection. Hot hole injection involves applying appropriate voltage potentials to the gate electrode and the drain, while floating or grounding the source, to erase one of the memory cells (typically the normal bit). Conversely, the complementary bit is erased by floating the drain and applying appropriate voltage potentials to the source and the gate. Alternatively, both the normal and complementary bits can be erased simultaneously.

In a flash memory array, numerous memory cells are typically erased simultaneously. Erasing of the memory cells can be accomplished by repeated applications of short erase pulses, as described above. After each erase pulse, an erase verification can be performed to determine if each cell in the array is "undererased," (i.e., whether the cell has a threshold voltage above a predetermined limit). If an undererased cell is detected, an additional erase pulse can be applied to the entire array. With such an erase procedure, cells that are not undererased will also be repeatedly erased, leading to some cells becoming "overerased" before other cells are sufficiently erased. A memory cell having a threshold voltage erased below a predetermined limit is commonly referred to as being overerased. In this case, the charge storing layer of the over-erased cells is depleted of electrons and becomes positively charged.

An over-erased condition is undesirable for many reasons. For instance, the programming characteristics of an over-erased cell deteriorate more rapidly, affecting, among other things, the number of times that a cell can be reprogrammed. Overerased cells are also undesirable because they can cause bitline leakage current during program and/or read procedures.

In view of the foregoing, a need exists for a device and method of erasing an array of multi-bit memory cells, which reduces overerasing and tightens threshold voltage distribution.

SUMMARY OF THE INVENTION

According to one aspect of the invention, the invention is directed to a method of erasing a flash electrically erasable programmable read only memory (EEPROM) device. The memory device can include a plurality of memory cells, each having a charge storing layer with at least a first charge storing cell and a second charge storing cell. The charge storing layer can be disposed between a top dielectric layer and a bottom dielectric layer. A gate electrode can be disposed above the top dielectric layer and the bottom dielectric layer can be disposed above a substrate. The substrate can include a first conductive region adjacent the first charge storing cell and a second conductive region adjacent the second charge storing cell. The method includes applying an erase pulse to the plurality of memory cells and erase verifying the plurality of memory cells to determine if there are any undererased memory cells in the plurality of memory cells. A positive gate stress is applied simultaneously to the plurality of memory cells.

According to another aspect of the invention, the invention is directed to a method to tighten a threshold voltage distribution curve in a memory device. The memory device can be comprised of a plurality of memory cells, each having a source and a drain disposed within a substrate. A bottom dielectric layer can be disposed above the substrate and a charge storing layer, which includes a normal bit adjacent the drain and a complementary bit adjacent the source, can be disposed above the bottom dielectric layer. A top dielectric layer can be disposed above the charge storing layer and a gate electrode can be disposed above the top dielectric layer. The memory cells can be organized in rows and columns, where the rows can be wordlines and the columns can be bitlines. The method includes, after an erase operation, applying a positive gate stress pulse to the gate electrode of each of the plurality of memory cells via the wordlines. The source and the drain of each of the plurality of memory cells is grounded via the bitlines.

According to another aspect of the present invention, the invention is directed to a flash electrically erasable programmable read only memory (EEPROM) device. The EEPROM device can include a plurality of memory cells each having a source and a drain disposed within a substrate and a bottom dielectric layer disposed above the substrate. A charge storing layer, which includes at least a first charge storing cell and a second charge storing cell, can be disposed above the bottom dielectric layer. A top dielectric layer can be disposed above the charge storing layer and a gate electrode can be disposed above the top dielectric layer. The memory cells can be organized in rows and columns with the rows being wordlines coupled to the gate electrodes and the columns being bitlines coupled to the source and the drain. The device can include peripheral circuitry operative to apply voltage potentials to the wordlines and bitlines for performing erasure of the memory cells and applying a positive gate stress to the plurality of memory cells to correct any memory cells that are overerased.

BRIEF DESCRIPTION OF DRAWINGS

These and further features of the present invention will be apparent with reference to the following description and drawings, wherein.

DISCLOSURE OF INVENTION

Figure 1:
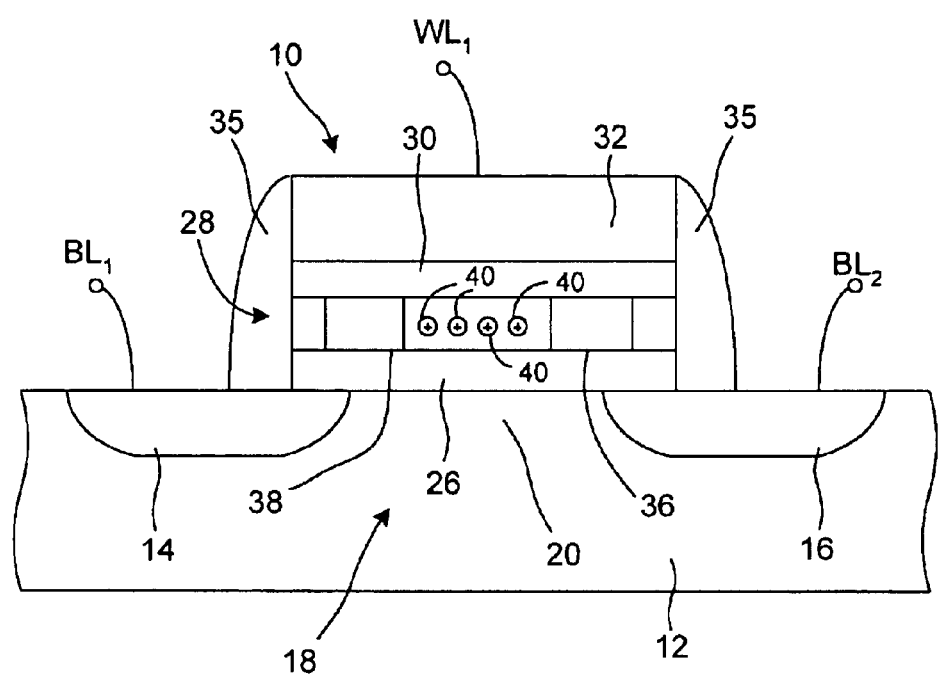
FIG. 1 is a schematic cross-section illustration of an exemplary overerased double-bit memory device to which a method of erasing a memory device may be applied in accordance with the present invention.

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

With reference to FIG. 1, an exemplary non-volatile, double-bit charge trapping dielectric flash electrically erasable programmable read only memory (EEPROM) device 10 in which one or more of the various aspects of the invention may be carried out is illustrated. The memory device 10 includes a P-type semiconductor substrate 12. Within the substrate 12, an N-type source 14 and N-type drain 16 are formed. A body 18 is disposed between the source 14 and the drain 16. The source 14 and the drain 16 can optionally include extension regions (sometimes referred to as lightly doped shallow implants) and deep-doped regions. The substrate 12, the source 14, the drain 16, and the body 18 can be formed, for example, from a semiconductor, such as appropriately doped silicon.

Above the body 18 is a dielectric layer 26 (also referred to as a tunneling oxide layer or bottom dielectric layer) that is made from, for example, silicon oxide ($SiO_2$), other standard-K material or a high-K material (e.g., having a relative permittivity in one embodiment above 10, and in another embodiment above 20).

Over the bottom dielectric layer 26 is a charge trapping layer (also referred to as a charge storing layer 28). The charge storing layer 28 can be made from, for example, a non-conductive material including silicon nitride ($Si_3N_4$), silicon oxide with varied polysilicon islands, implanted oxide and the like.

Over the charge storing layer 28 is another dielectric layer 30 (also referred to as a top dielectric layer) made from a material such as, for example, silicon oxide, other standard-K material or a high-K material.

Over the top dielectric layer 30 is a gate electrode 32. The gate electrode 32 can be made from, for example, polycrystalline silicon ("poly") or another appropriate material, such as a metal or metal oxide. The gate electrode 32, the top dielectric layer 30, the charge storing layer 28, and the bottom dielectric layer 26 form a stacked gate. Sidewall spacers 35 can be disposed adjacent lateral sidewalls of the stacked gate for use in controlling dopant implantation, device properties, and the like. A work function of the stacked gate controls a channel 20 within the body 18. The channel 20 extends from the source 14 to the drain 16.

As one skilled in the art will appreciate, modifications to the stacked gate and formation of the source 14, the drain 16, and the body 18 can be made. Such modifications can include changes to the physical arrangement of the memory device 10, materials used, dopant parameters and the like. However, the programming and erasing techniques described herein can be used in conjunction with a modified device without departing from the scope of the present invention.

The memory device 10 is operatively arranged to be programmed, verified, read, and erased by the application of appropriate voltage potentials to each of the gate electrode 32, the source 14, and the drain 16. More specifically, the gate electrode 32 can be coupled to or formed from a wordline ($WL_1$), the source 14 can be coupled to or formed from a first bitline ($BL_1$) and the drain 16 can be coupled to or formed from a second bitline ($BL_2$) for applying various voltage potentials to the corresponding components of the memory device 10.

Figure 2:
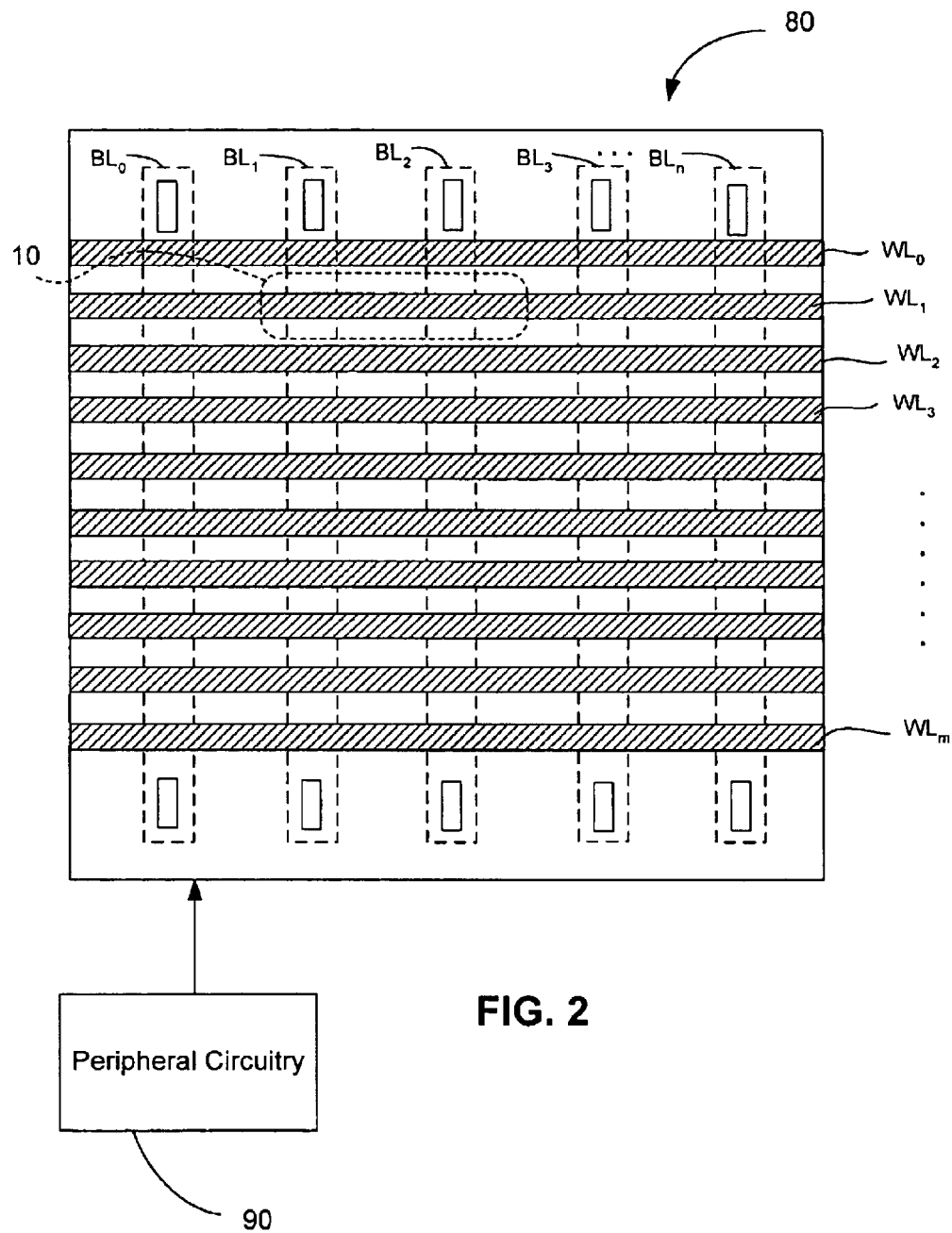
FIG. 2 is a top schematic view of a portion of an exemplary array of memory cells to which a method of erasing an array may be applied in accordance with the present invention.

As shown in FIG. 2, the memory cells or devices 10 are organized in an array 80 of rows and columns, where each row is a wordline ($WL_0$, $WL_1$, . . . $WL_m$) coupled to or forming the gate electrode of each memory cell and the columns are bitlines ($BL_0$, $BL_1$, . . . $BL_n$) coupled to or forming the source and drain of each memory cell. Voltage potentials are applied to corresponding components of each memory device, such as the bitlines ($BL_0$, $BL_1$, . . . $BL_n$) and wordlines ($WL_0$, $WL_1$, . . . $WL_m$), using peripheral circuitry 90, including, but not limited to, power sources, bitline drivers and/or controllers, and wordline drivers and/or controllers.

In one embodiment, the memory device 10 can be configured as virtual ground device. That is, during various operations of the memory device 10, either of the source 14 or the drain 16 can function as a source of electrons and either of the source 14 or the drain 16 can be grounded or connected to a bias potential. In addition, the memory device 10 can be connected in series with at least one adjacent memory device (as shown in FIG. 2) such that the source 14 can be formed from a conductive region, which also forms a drain of the adjacent memory device.

In one embodiment, the conductive region can be implemented as a buried bitline. Accordingly, the drain of the adjacent memory device is also coupled to the second bitline $BL_2$. A source of the adjacent memory device can be coupled to or formed from a third bitline $BL_3$. A gate electrode of the adjacent memory device can also be coupled to or formed from the first wordline $WL_1$. Similarly, the drain 16 can be formed from a conductive region that also forms the source of another memory device disposed adjacent the drain 16 side of the memory device 10. It is noted that the sources and drains of adjacent memory devices need not be formed from a single conductive region, but can be formed from separate structures that are electrically connected together (e.g., a pair of conductive regions spaced apart by a trench isolation region and connected by a conductive layer, such as a silicide).

In yet another embodiment, the bottom dielectric layer 26, a charge storing layer 28, and the top dielectric layer 30 can form a continuous stack layer (or "ONO layer") under which bitlines run (these "buried" bitlines also serve as the source 14 and the drain 16). Wordlines, which also serve as the gate electrodes, can run over the ONO layer. Examples of this embodiment are shown and described in greater detail in co-owned U.S. Pat. Nos. 6,307,784 and 6,442,074, the disclosures of which are hereby incorporated by reference in their entireties.

Referring back to FIG. 1 and as will become more apparent from the discussion below, within the charge storing layer 28 the memory device 10 includes a first charge storing region or cell 36 (also referred to herein as a first cell or normal bit) adjacent the drain 16 and a second charge storing region or cell 38 (also referred to herein as a second cell or complementary bit) adjacent to the source 14. In the illustrated embodiment, the memory device 10 is a structurally symmetrical device, allowing for programming, verifying, reading, and erasing of the first charge storing cell 36 and the second charge storing cell 38 by respectively switching the roles of the source 14 and the drain 16 during those operations. Accordingly, the terms source and drain can be used interchangeably depending upon which of the normal bit 36 or the complementary bit 38 is being programmed, verified, read, or erased.

With continued reference to FIG. 1, programming of the charge storing cells 36 and 38 from a blank state (e.g., representing a binary value of "1" to a charge state (e.g., representing a binary value of "0") can be carried out using conventional techniques. It is noted that the blank state corresponds to an amount of charge being stored by the charge storing cell 36, 38 that, during a read operation, would place a threshold voltage ($V_T$) of the memory cell 10 equal to or less than an erase threshold voltage and within an erase state threshold voltage distribution. The programmed state corresponds to an amount of charge being stored by the charge storing cell 36, 38 that, during the read operation, would place the threshold voltage of the memory cell 10 within a threshold voltage distribution that is higher than the erase threshold voltage and within a programmed state threshold distribution. In one embodiment, the memory cell 10 can be programmed using multi-level cell (MLC) programming. MLC programming can be accomplished by programming each charge storing cell 36, 38 with an amount of charge selected from one of a plurality of distinguishable amounts of charge, referred to as program levels. In one embodiment, there are four program levels (or distinguishable charge amounts for each charge storing cell 36, 38, including an unprogrammed state (also referred to as "blank"), a lowest or first charge amount (also referred to as "level one"), a medium or second charge amount (also referred to as "level two") and a highest or third charge amount (also referred to as "level three").

In one embodiment, the programming technique involves hot electron injection, also referred to as channel hot electron injection (CHE). However, it should be appreciated that modifications to the programming techniques can be made to accommodate variations in the specific memory device used.

Using hot electron injection, the first charge storing cell 36 can be programmed by applying voltages to the drain 16 and to the gate electrode 32. The source 14 functions as a source of electrons for the CHE programming of the first charge storing cell 36. In one embodiment, a voltage potential is also applied to the source 14 (rather than grounding or floating the source 14, as found in conventional charge trapping dielectric flash devices).

The voltages applied to the gate electrode 32, the source 14 and the drain 16 generate a vertical electric field through the dielectric layers 26, 30 and the charge storing layer 28 and a lateral electric field along the length of the channel 20 from the source 14 to the drain 16. At a given threshold voltage, the channel 20 inverts such that electrons are drawn off the source 14 and begin accelerating towards the drain 16. As the electrons move along the length of the channel 20, the electrons gain energy and, upon attaining enough energy, the electrons jump over the potential barrier of the bottom dielectric layer 26 and into the charge storing layer 28, where the electrons become trapped The probability of electrons jumping the potential barrier is a maximum in the area of the first charge storing cell 36, adjacent the drain 16, where the electrons have gained the most energy. These accelerated electrons are termed hot electrons and, once injected into the charge storing layer, stay in the first charge storing cell 36 of the charge storing layer 28. The trapped electrons tend not to spread laterally through the charge storing layer 28 due to this layer's low conductivity and low lateral electric field therein. Thus, the trapped charge remains localized in the charge trapping region of the first charge storing cell 36 adjacent the drain 16.

The foregoing technique to program the first charge storing cell 36 can be used to program the second charge storing cell 38, but the functions of the source 14 and the drain 16 are reversed. More specifically, appropriate voltages are applied to the source 14, the drain 16, and/or the gate electrode 32 such that the drain 16 functions as a source of electrons that travel along the channel 20 from the drain 16 towards the source 14. Accordingly, the terms source and drain can be used interchangeably. However, for purposes herein, programming of either charge storing cell 36, 38 will be described using nomenclature such that the source 14 functions as the source of electrons, as us conventional in the art.

Table 1 includes exemplary voltage potentials and pulse durations that can be applied to the gate electrode 32, the source 14, and the drain 16 to program the charge storing cells 36, 38. It is noted that the values presented in Table 1 will vary depending on the specific characteristics of the memory device 10 being programmed.

TABLE 1

|  | Gate Voltage | Source Voltage | Drain Voltage | Pulse Length |
|---|---|---|---|---|
| First Cell | 8–12 volts | 0 volts | 4–6 volts | 1 microsec |
| Second Cell | 8–12 volts | 4–6 volts | 0 volts | 1 microsec |

Verifying the programming of the memory device 10 and reading of the memory device 10 can be carried out using conventional techniques. For example, the charge storing cells 36, 38 can be read in a reverse direction with respect to the direction of programming.

While, for purposes of simplicity of explanation, the methodology of FIGS. 3–6 are shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect of the invention.

With additional reference to FIG. 3, a method of erasing an array of flash EEPROM memory cells will be described. The erase method begins with a pre-programming step 100 in which one or both of the normal bit 36 and complementary bit 38 of each memory cell 10 in the array or sector of the memory device are programmed to approximately the same charge level. Pre-programming of the charge storing cells 36, 38 can include injecting charge into the cells 10 via channel hot electron injection or another suitable technique. More specifically, sufficient charge can be injected or otherwise programmed into the charge storing cells 36, 38 to preprogram the device with all "0's" (i.e., a programmed state). The purpose of preprogramming is to bring all of the memory cells to the same level in an effort to avoid having some memory cells, which were either not programmed or may have lost charge during normal operations, from being substantially overerased.

At step 110, each charge storing cell 36, 38, which was pre-programmed at step 100, can be erased by the application of one or more appropriate erase pulses. Erasing of the charge storing cells 36, 38 can be accomplished using hot hole injection. However, it is to be appreciated that other appropriate erase operations may be employed. In one embodiment, for example, each charge storing cell (the normal bit 36 and the complementary bit 38) of each memory cell 10 can be erased simultaneously by applying a negative erase voltage (e.g., about −5 volts to about −10 volts) to the gate electrode via the wordlines (WL$_0$, WL$_1$, ... WL$_m$) and applying a positive bias voltage (e.g., about +4 volts to about +8 volts) to both the drain 16 and the source 14 via the bitlines (BL$_0$, BL$_1$, ... BL$_n$). Alternately, all of the normal bits and all of the complementary bits can be erased separately by applying appropriate voltage potentials to accomplish drain side hot hole injection and source side hot hole injection, respectively. Preferably, all or most of the memory cells within an array or sector are erased simultaneously.

Following the application of an erase pulse 110 to each of the charge storing cells, an erase verification is performed at step 120. More specifically, the erase verification 120 is employed to determine whether any of the charge storing cells 36, 38 within each memory cell 10 have been undererased. Determining whether any cells have been undererased includes reading each charge storing cell 36, 38 (e.g., reading in the reverse direction) to determine whether the threshold voltage ($V_T$) is above a predetermined maximum value for an erased state. If the threshold voltage is above the predetermined maximum value for an erased state, the cell is determined to be undererased and another erase pulse is applied to all memory cells within the array at step 110. Steps 110 and 120 are applied until all bits 36, 38 of all memory cells 10 within a sector have passed the erase verification at step 120, and therefore, are determined to be erased.

Referring back to FIG. 1, after the erase and verification steps 110 and 120, it is possible that some cells within the array or sector are overerased. That is, some cells can have excess positive charge or holes 40 trapped within the charge storing layer 28. In this case, the charge storing layer 28 of the over-erased cells is depleted of electrons and is positively charged. The positive charge 40 may be trapped within the charge storing layer 28 above the channel region 20 (as shown), may be trapped on the ends of the each cell (e.g., laterally outside each of the charge storing cells 36, 38) or outside the gate stack entirely (e.g., in between the wordlines). In one embodiment, overerased cells have a threshold voltage below zero volts. Alternatively, the overerased cells may have a positive threshold voltage, which is still below a desired or predetermined minimum threshold voltage.

Figure 3:
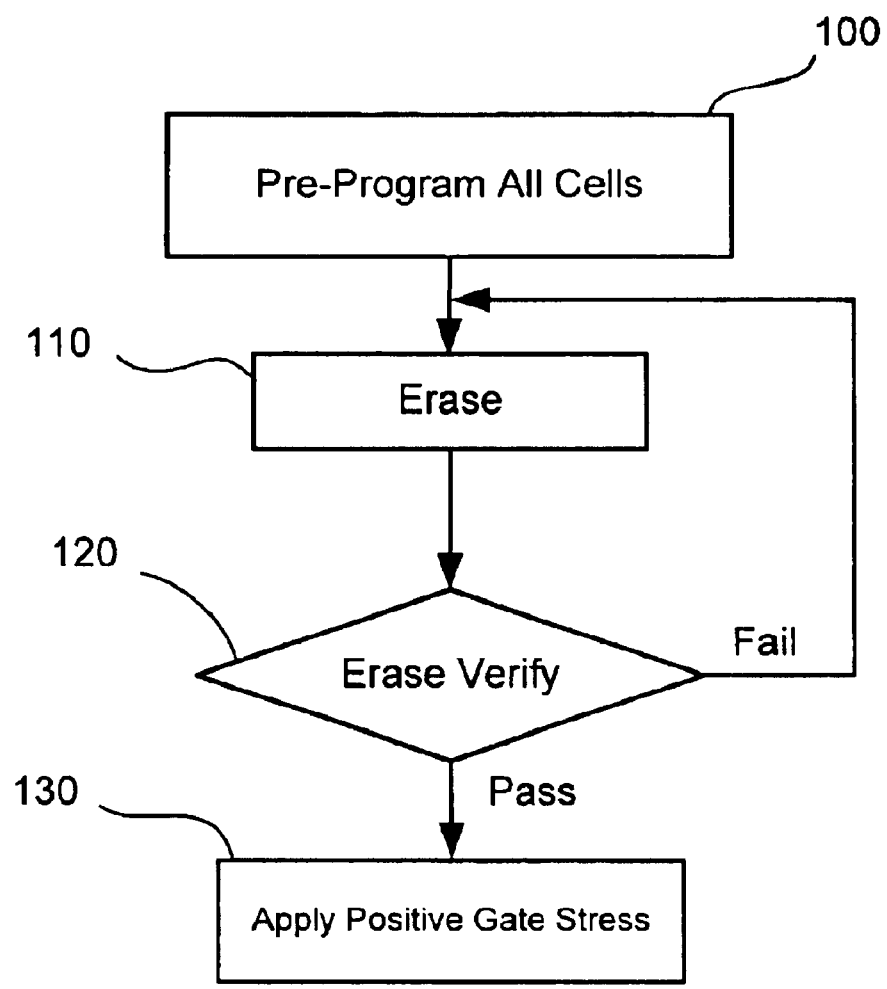
FIG. 3 is a flow chart illustrating a method of erasing a memory device in accordance with one embodiment of the present invention.

In one embodiment, illustrated in FIG. 3, a positive gate stress operation is simultaneously applied to all cells within an array or a sector at step 130. In one embodiment, for example, the positive gate stress operation 130 includes applying a positive gate voltage of, for example, about 8 volts to about 12 volts to all of the wordlines (gate electrodes) simultaneously, while grounding all of the bitlines (sources and drains). The positive gate stress can be applied for a duration of between about 1 millisecond (ms) and about 5 seconds, for example. However, positive gate stress pulses of other time durations may be utilized.

The positive gate stress operation 130 provides a method of simultaneously correcting or otherwise compensating an array of overerased dual-bit memory cells. In addition, as is discussed more fully below, utilization of the positive gate stress operation results in tighter threshold voltage distributions.

Figure 4:
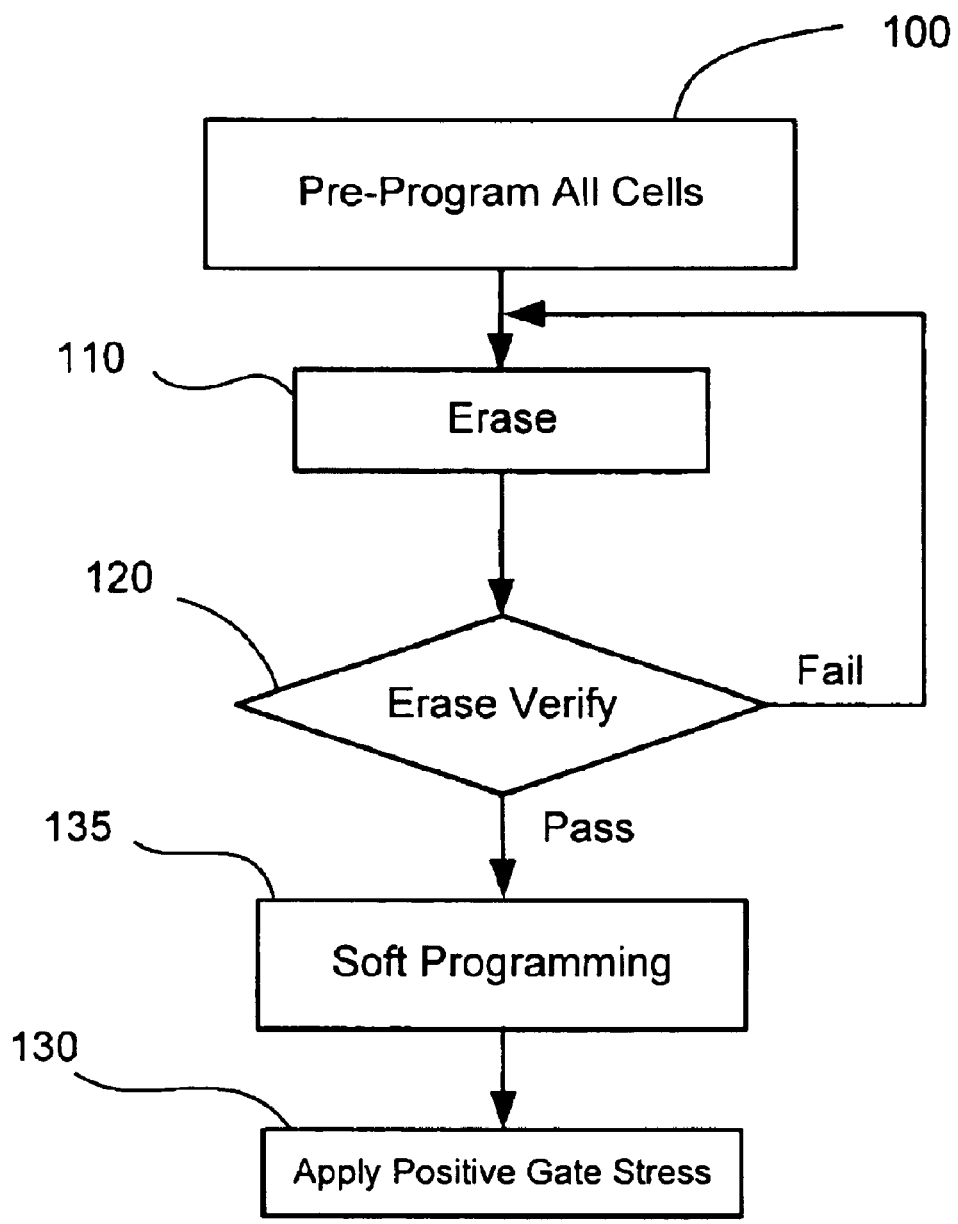
FIG. 4 is a flow chart illustrating a method of erasing a memory device in accordance with an alternative embodiment of the present invention.
Figure 5:
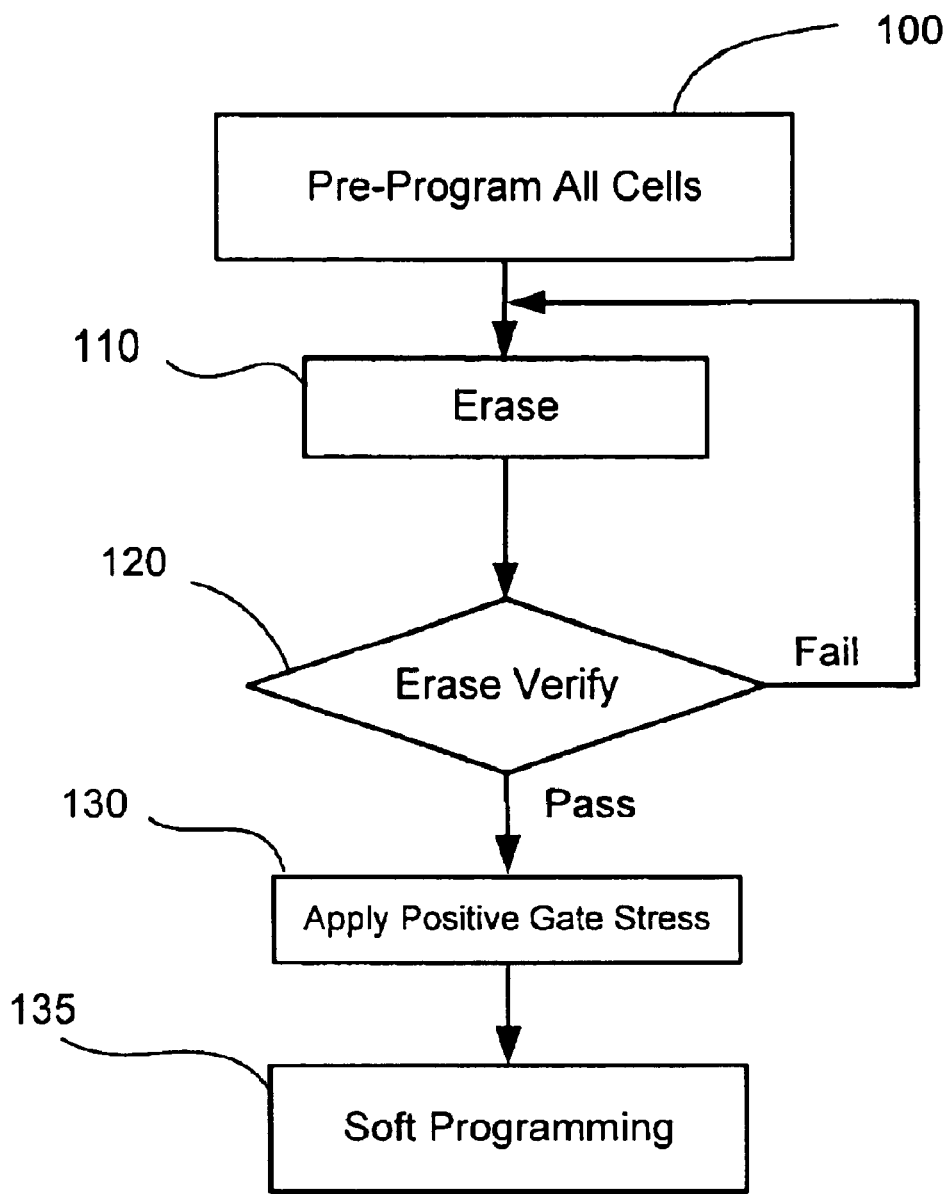
FIG. 5 is a flow chart illustrating a method of erasing a memory device in accordance with an alternative embodiment of the present invention.

In an alternate embodiment, illustrated in FIGS. 4 and 5, the positive gate stress 130 is coupled with a soft programming operation 135 for enhanced performance and effectiveness. In one embodiment (FIG. 4), the soft programming operation 135 precedes the positive gate stress 130. Alternatively, as illustrated in FIG. 5, the positive gate stress 130 is performed first, followed by appropriate soft programming 135. Soft programming 135 can be performed on a cell-by-cell basis or on a column-by-column basis. Optionally, the soft programming operation 135 can be accompanied by a soft programming verify operation to determine whether any memory cells have a threshold voltage below a predetermined minimum value $V_{TMIN}$, which may or may not be below zero volts. The positive gate stress 130 in conjunction with soft programming 135 is particularly effective for correcting cells having extremely low threshold voltages (e.g., at or below the predetermined $V_{TMIN}$).

In one embodiment, soft programming of a normal bit 36 is performed by applying a voltage potential (e.g., about +4 volts to about +8 volts), to the gate electrode and a voltage potential (e.g., about +3 volts to about +5 volts), to the drain, while grounding or floating the source. In one embodiment, the soft programming is applied as a pulse having a duration between about 0.5 microsec ($\mu$s) and about 0.5 sec. It is to be appreciated that these voltage potentials and durations may be varied to select at what point along the channel 20 charge is injected into the charge storing layer 28. Further, the voltage potentials may be modulated, as is known in the art.

Figure 6:
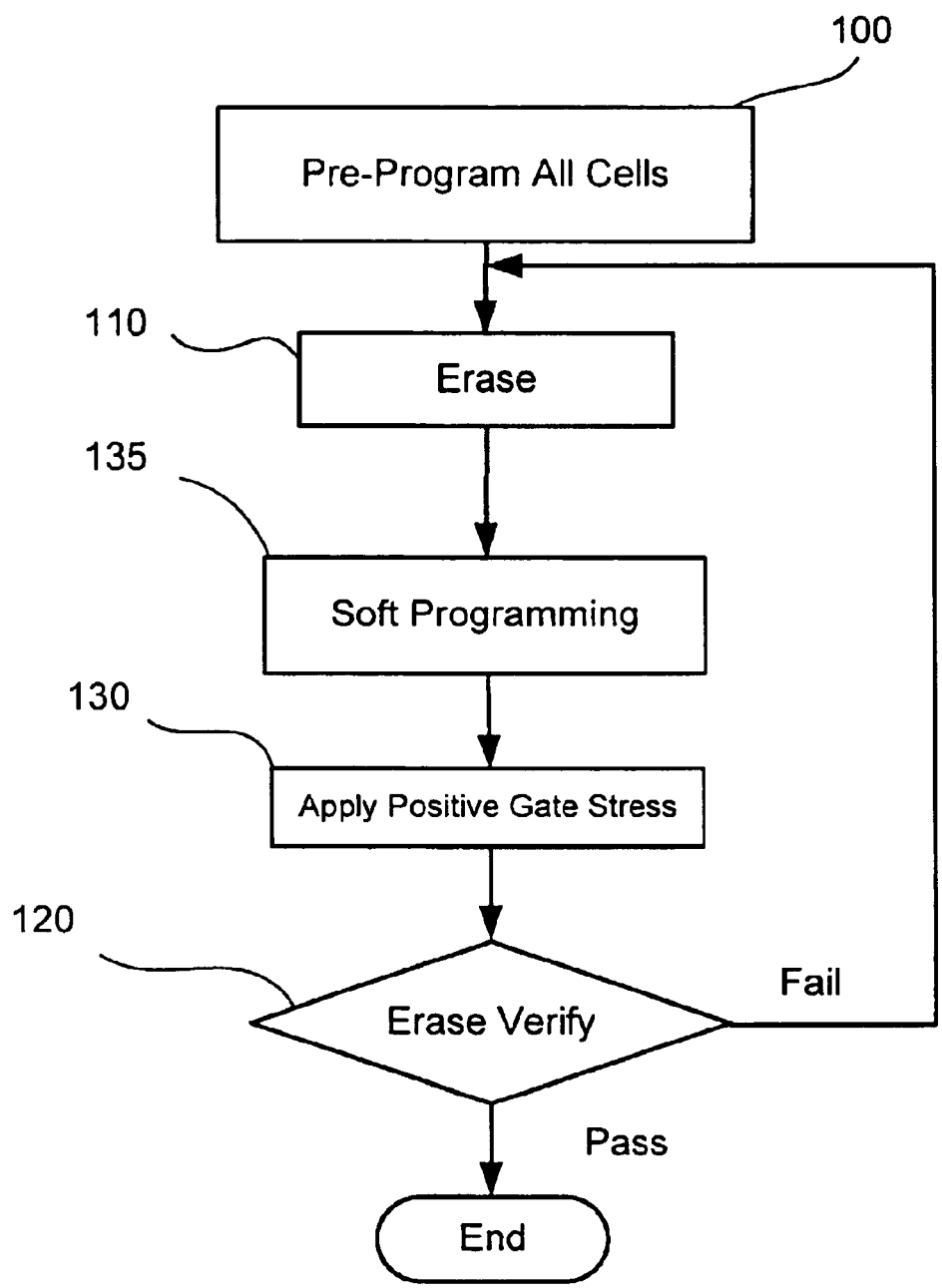
FIG. 6 is a flow chart illustrating a method of erasing a memory device in accordance with an alternative embodiment of the present invention.

Alternatively, as illustrated in FIG. 6, the erase step 110 is followed by a soft programming step 135 and a positive gate stress 130 step, each as described above. In this embodiment, the erase verify 120 operation is performed after the overerase compensation steps (i.e., soft programming 135 and positive gate stress 130) to determine if any of the memory cells are undererased. If one or more memory cells are determined to be undererased, steps 110, 135, 130, and 120 are repeated until all of the memory cells within the array are neither undererased nor overerased.

In all of the embodiments illustrated in FIGS. 3–6, the positive gate stress 130 and soft programming 135 are preferably made as part of an embedded erase sequence algorithm.

Figure 7:
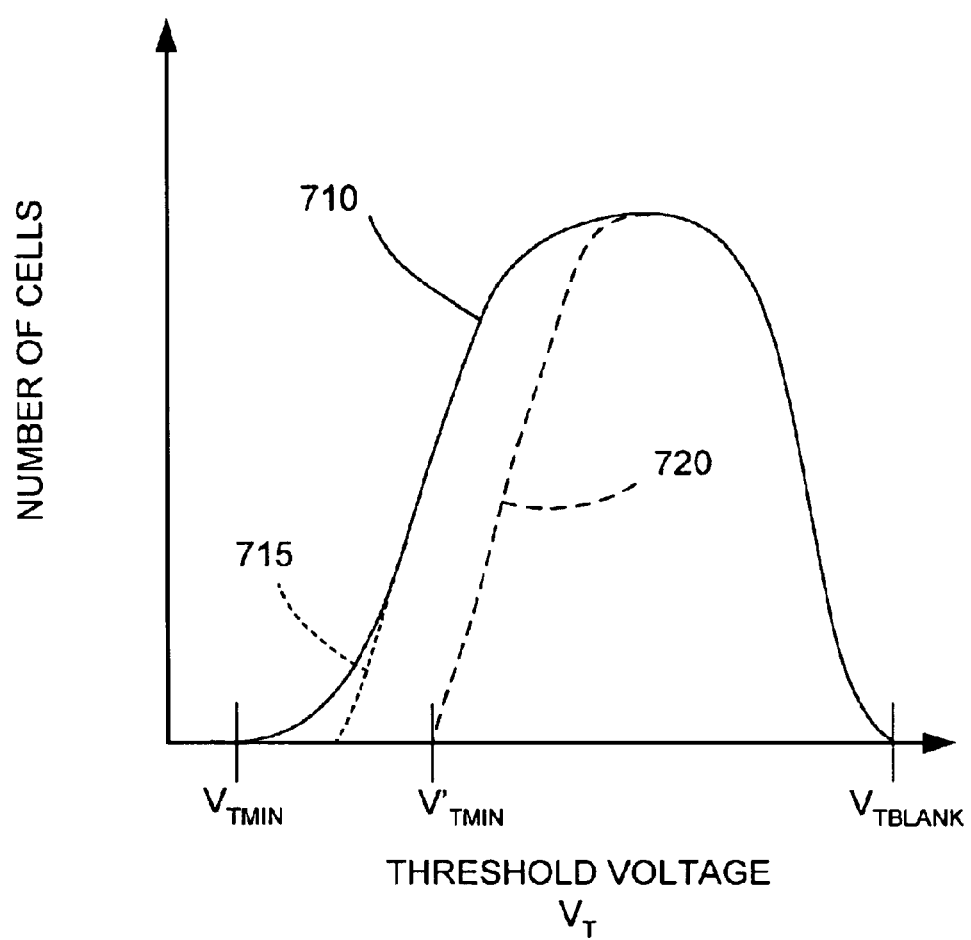
FIG. 7 illustrates a threshold voltage distribution after an erase operation in accordance with the present invention.

With reference now to FIG. 7, an exemplary plot of the number of cells versus threshold voltage $V_T$ is provided. The solid curve 710 represents the threshold voltage of cells after an erase operation (such as is illustrated and described at step 120 of FIGS. 3–6). The dashed portion 715 indicates how the positive gate stress and, optionally soft programming, corrects the most overerased cells and is typically successful in increasing the threshold voltage of the most overerased cells to zero volts. The dashed line 720 represents the threshold voltage distribution of memory cells after the method in accordance with the present invention. Without intending to be bound by theory, the positive gate stress employed in the present invention is effective to provide a threshold voltage distribution that is approximately 30% tighter than is achieved using conventional erase sequences (illustrated by the difference between $V_{TMIN}$ and $V'_{TMIN}$).

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of erasing a flash electrically erasable programmable read only memory (EEPROM) device which includes a plurality of memory cells each having a charge storing layer including at least a first charge storing cell and a second charge storing cell, the charge storing layer being disposed between a top dielectric layer and a bottom dielectric layer, and a gate electrode disposed above the top dielectric layer, the bottom dielectric layer disposed above a substrate having a first conductive region adjacent the first charge storing cell and a second conductive region adjacent the second charge storing cell, said method comprising:
   (a) applying an erase pulse to the plurality of memory cells;
   (b) erase verifying the plurality of memory cells to determine if there are any undererased memory cells in the plurality of memory cells; and
   (c) applying a positive gate stress to the plurality of memory cells to reduce the amount of positive charge within the charge storing layer.

2. The method according to claim 1, further comprising:
   repeating steps (a) and (b) until all of the memory cells verify as not being undererased.

3. The method according to claim 2, further comprising:
   preprogramming the plurality of memory cells to a predetermined level.

4. The method according to claim 2, wherein applying the positive gate stress is effective to correct any memory cells that are overerased.

5. The method according to claim 3, wherein step (c) includes:
   grounding all bitlines coupled to at least one of the first and second conductive regions of each memory cell of the plurality of memory cells;
   applying a positive voltage to all wordlines coupled to the gate electrodes of each memory cell of the plurality of memory cells.

6. The method according to claim 5, wherein the positive voltage applied to all of the wordlines is between about +9 volts and about +11 volts.

7. The method according to claim 6, wherein the positive voltage is applied as a voltage pulse having a duration of about 1 millisec (ms) to about 5 sec.

8. The method according to claim 1, further comprising:
   applying a soft programming pulse to any memory cells in the plurality of memory cells which have a threshold voltage below a predefined minimum value.

9. The method according to claim 8, wherein applying a soft programming pulse includes:
   applying a voltage potential of about +4 volts to about +8 volts to the gate electrode; and
   applying a voltage potential of about +3 volts to about +5 volts to at least one of the first and second conductive regions.

10. The method according to claim 8, further comprising:
    before the step of applying a soft programming pulse, soft program verifying the plurality of memory cells to determine whether any of the memory cells have a threshold voltage below the predefined minimum value.

11. The method according to claim 2, wherein step (a) includes:
    applying a negative gate erase potential of between about −5 volts and about −10 volts to the gate electrodes of the plurality of memory cells, and
    applying a voltage potential of between about +4 volts and about +8 volts to at least one of the first and second conductive regions of the plurality of memory cells.

12. A method to tighten a threshold voltage distribution curve in a memory device comprised of a plurality of memory cells each having a source and a drain disposed within a substrate, a bottom dielectric layer disposed above the substrate, a charge storing layer including a normal bit adjacent the drain and a complementary bit adjacent the source disposed above the bottom dielectric layer, a top dielectric layer disposed above the charge storing layer, and a gate electrode disposed above the top dielectric layer, wherein the memory cells are organized in rows and columns with the rows being wordlines and the columns being bitlines, the method comprising:
    after an erase operation, applying a positive gate stress pulse to the gate electrode of each of the plurality of memory cells via the wordlines; and
    grounding the source and the drain of each of the plurality of memory cells via the bitlines.

13. The method according to claim 12, wherein the positive gate stress pulse is about +8 volts to about +12 volts.

14. The method according to claim 13, wherein the positive gate stress pulse has a duration of about 1 millisec (ms) to about 5 sec.

15. The method according to claim 12, further comprising:
    determining whether any of the plurality of memory cells has a threshold voltage below a predetermined minimum threshold voltage $V_{TMIN}$; and
    applying a soft programming pulse to any memory cells having a threshold voltage below $V_{TMIN}$.

16. The method according to claim 15, wherein applying a soft programming pulse includes:
    applying a voltage potential of about +4 volts to about +8 volts to the gate electrode of each memory cell having a threshold voltage below $V_{TMIN}$; and
    applying a voltage potential of about +3 volts to about +5 volts to at least one of the source and the drain of each memory cell having a threshold voltage below $V_{TMIN}$.

17. The method according to claim 16, wherein the soft programming pulse has a duration of about 0.5 microsec ($\mu$s) to about 0.5 sec.

18. A flash electrically erasable programmable read only memory (EEPROM) device comprising:
   a plurality of memory cells each having:
      a source and a drain disposed within a substrate;
      a bottom dielectric layer disposed above the substrate;
      a charge storing layer including at least a first charge storing cell and a second charge storing cell disposed above the bottom dielectric layer;
      a top dielectric layer disposed above the charge storing layer; and
      a gate electrode disposed above the top dielectric layer;
      wherein the memory cells are organized in rows and columns with the rows being wordlines coupled to the gate electrodes and the columns being bitlines coupled to the source and the drain; and
   peripheral circuitry operative to apply voltage potentials to the wordlines and bitlines for performing erasure of the memory cells and applying a positive gate stress to the plurality of memory cells to correct any memory cells that are overerased.

19. The flash EEPROM device according to claim 18, wherein the peripheral circuitry is further operative to apply a positive gate stress voltage between about +8 volts and about +12 volts to all wordlines coupled to the gate electrodes and to ground all bitlines coupled to at least one of the source and the drain.

20. The flash EEPROM device according to claim 19, wherein the peripheral circuitry is further operative to apply a soft programming pulse to any memory cells in the plurality of memory cells that have a threshold voltage below a predefined minimum value.

* * * * *